(12) United States Patent
Watanabe et al.

(10) Patent No.: US 7,964,962 B2
(45) Date of Patent: Jun. 21, 2011

(54) METHOD OF MANUFACTURING A SEMICONDUCTOR APPARATUS

(75) Inventors: Mitsuhisa Watanabe, Tokyo (JP); Ichiro Anjoh, Tokyo (JP)

(73) Assignee: Elpidia Memory, Inc., Tokyo (JP)

( * ) Notice: Subject to any disclaimer, the term of this patent is extended or adjusted under 35 U.S.C. 154(b) by 209 days.

(21) Appl. No.: 12/173,245

(22) Filed: Jul. 15, 2008

(65) Prior Publication Data
US 2009/0020873 A1    Jan. 22, 2009

(30) Foreign Application Priority Data
Jul. 18, 2007 (JP) ................................ 2007-186895

(51) Int. Cl.
H01L 23/48 (2006.01)
(52) U.S. Cl. . 257/737; 257/778; 257/783; 257/E21.502; 438/109; 438/113; 438/613
(58) Field of Classification Search .......... 438/106–113; 257/730–737, 778–783
See application file for complete search history.

(56) References Cited

U.S. PATENT DOCUMENTS

| | | | |
|---|---|---|---|
| 6,064,114 A | 5/2000 | Higgins, III | |
| 6,137,185 A * | 10/2000 | Ishino et al. | 257/786 |
| 6,975,035 B2 | 12/2005 | Lee | |
| 7,314,780 B2 * | 1/2008 | Shimizu et al. | 438/108 |

FOREIGN PATENT DOCUMENTS

| | | |
|---|---|---|
| JP | 2000-003939 | 7/2000 |
| JP | 2000-106257 | 11/2000 |
| JP | 2004-006670 | 8/2004 |
| JP | 2005-032820 | 3/2005 |
| KR | 1020000068303 | 11/2000 |
| KR | 10-0332863 | 4/2002 |
| KR | 20020049821 | 6/2002 |
| WO | WO99/23696 | 5/1999 |

OTHER PUBLICATIONS

KR Office Action dated Jul. 1, 2010 (English translation attached).
German Office Action and its English translation of Oct. 18, 2010 in corresponding German Serial No. 10 2008 031 511.7-33.

* cited by examiner

Primary Examiner — Dung A. Le
(74) Attorney, Agent, or Firm — Young & Thompson

(57) ABSTRACT

A method of making a semiconductor apparatus provides a plurality of electrode pads on a main surface of a semiconductor chip, and a plurality of bump electrodes on the electrode pads. The method also provides a wired board which is allocated in a side of the main surface of the chip and is positioned in a central area of the main surface of the chip so as to be separated from an edge part of the chip by at least 50 μm or more, a plurality of external terminals on the wired board and which are electrically connected to a plurality of bump electrodes through wirings of the wired board, and a sealing part between the chip and the wired board, the sealing part being made of underfill material that covers a connection part between the bump electrode and the wiring.

21 Claims, 16 Drawing Sheets

METHOD OF MANUFACTURING A SEMICONDUCTOR APPARATUS

BACKGROUND OF THE INVENTION

This application is based upon and claims the benefit of priority from Japanese patent application No. 2007-186895, filed on Jul. 18, 2007, the disclosure of which is incorporated herein in its entirety by reference.

1. Field of the Invention

The present invention relates to a semiconductor apparatus in which a wired board is mounted on a semiconductor chip, and a method of manufacturing the semiconductor apparatus.

2. Description of the Related Art

For example, as disclosed in Japanese Patent Laid-Open No. 9-260536, in the semiconductor apparatus according to the present invention, a flexible wired board is allocated on a main surface of the semiconductor chip through the elastomer. The semiconductor apparatus is configured so that an electrode pad of the semiconductor chip and a lead part of a wiring allocated in an aperture part of the wired board are electrically connected, an external terminal is included on the other surface of the wired board, and the electrode pad of the semiconductor chip allocated in the aperture part of the wired board, and the lead part are covered with sealing material made of insulating resin.

Since such a semiconductor apparatus according to the present invention is configured so that the electrode pad of the semiconductor chip and the lead part of the wired board are connected at the aperture part provided on the wired board, the semiconductor apparatus is structured so that the external terminal can not be provided just below the electrode pad of the semiconductor chip.

Year by year, since an operation rate of the semiconductor apparatus has been increased, if a distance from the electrode pad of the semiconductor chip, e.g. a wiring length, becomes long, the operation rate may be lowered. Thus, there is a requirement to largely shorten the wiring length of the semiconductor apparatus to obtain favorable electrical characteristics.

Since the external terminal can not be provided just below the electrode pad of the semiconductor chip, the number of the external terminals may have to be reduced, which are allocated in an area, in which the semiconductor chip is mounted, of the wired board. The number of the external terminals of the semiconductor apparatus has been increased, and it becomes necessary to allocate the external terminals outside the area, in which the semiconductor chip is mounted, of the wired board, so that an area of the wired board may be increased. If the area of the wired board is increased, a package size of the semiconductor apparatus is increased. Further, if the area of the wired boards is increased, the number of the wired boards to be produced for each shot is reduced when the wired board is produced, and a cost of the wired board is increased.

The semiconductor apparatus according to the present invention is configured so that the semiconductor chip is mounted on the wired board through the elastomer (elastic material) to improve the reliability of the secondary installation of the semiconductor apparatus. However, while it is possible to reduce the stress because of the difference between the thermal expansion coefficients, and to improve the reliability of the secondary installation by mounting the semiconductor chip on the wired board through the elastomer, the elastomer is expensive material, so that the production cost of the semiconductor apparatus may be increased.

In addition, in the semiconductor apparatus according to the present invention, the semiconductor chip is mounted on a flexible wired board according to the TAB (Tape Automated Bonding) method, so that the necessary mounting accuracy may have not been obtained because of the influence of the sheet size tolerance or the roll, or the expensive mounting facility may have be necessary. In addition, since the pitch of the electrode pad and the wiring of the semiconductor apparatus has been narrowed, it becomes necessary to improve the mounting accuracy.

SUMMARY OF THE INVENTION

An object of the present invention is to provide the semiconductor apparatus in which the number of the wired boards to be produced for each shot is prevented from being reduced, favorable electrical characteristics are obtained, and reliability is improved by reducing stress applied to the semiconductor chip.

To achieve the above object, the semiconductor apparatus according to the present invention is provided with the semiconductor chip in which a plurality of the electrode pads are provided on a main surface, a plurality of bump electrodes are provided on the electrodes of the semiconductor chip, the wired board is allocated in a main surface side of the semiconductor chip, and is positioned in an area of the main surface of the semiconductor chip so as to be separated from an edge part of the semiconductor chip by at least 50 µm or more, a plurality of the external terminals which are provided on the wired board, and are electrically connected to a plurality of bump electrodes through the wirings of the wired board, and a insulating sealing part is provided between the semiconductor chip and the wired board, and covers a connection part between the bump electrode and the wiring.

According to the present invention, the number of the wired boards to be produced for each shot can be prevented from being reduced, favorable electrical characteristics can be obtained, and reliability can be improved by reducing stress applied to the semiconductor chip.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 1:
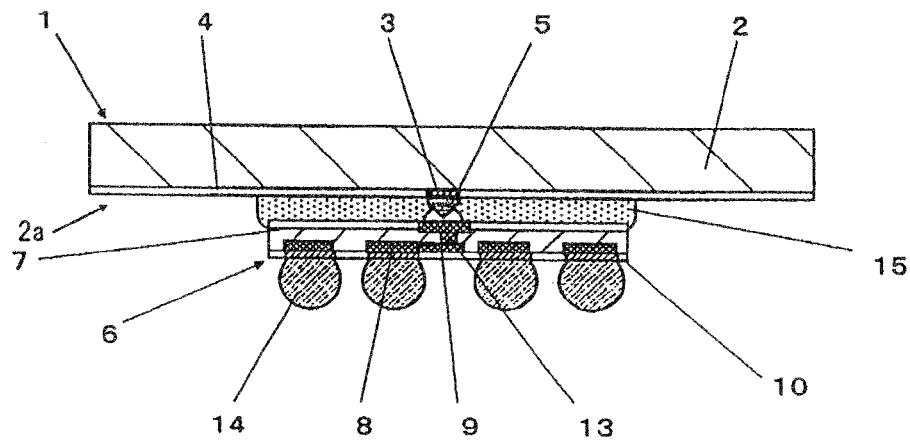
FIG. 1 is a side cross-section diagram of a semiconductor apparatus according to a first exemplary embodiment of the present invention.

Next, exemplary embodiments of the present invention will be described in detail by referring to the drawings.

First Exemplary Embodiment

Figure 2:
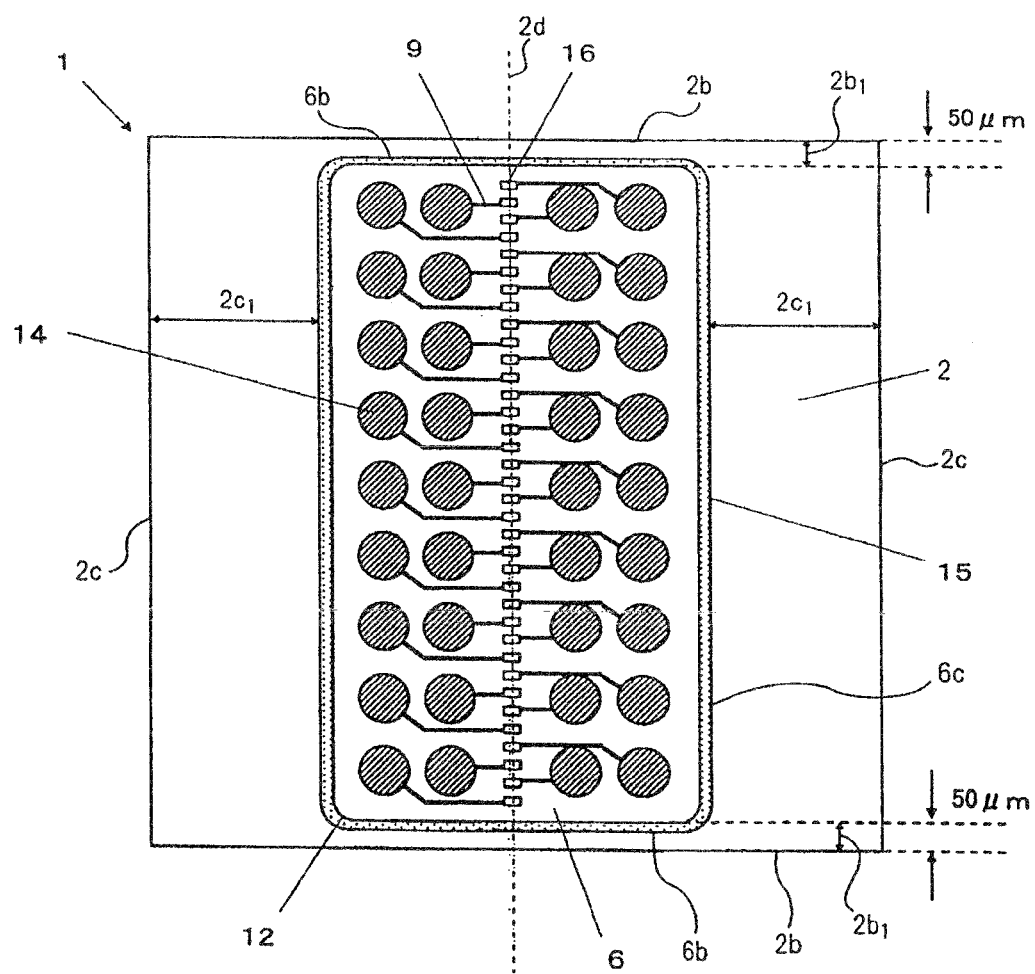
FIG. 2 is a plane diagram of the semiconductor apparatus according to the first exemplary embodiment of the present invention.
Figure 3:
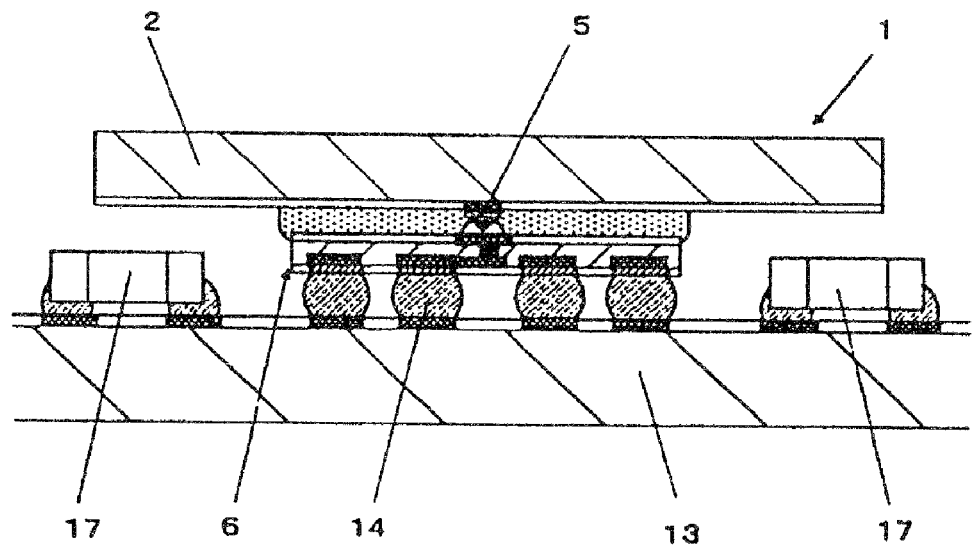
FIG. 3 is a diagram illustrating such an exemplary embodiment in which the semiconductor apparatus according to the first exemplary embodiment of the present invention is installed on a motherboard.

FIG. 1 and FIG. 2 are diagrams illustrating a package structure of semiconductor apparatus 1 of a BGA (Ball Grid Array) type according to the present exemplary embodiment. FIG. 1 is a side cross-section diagram, and FIG. 2 is a plane diagram. FIG. 3 is a diagram illustrating such an exemplary embodiment in which semiconductor apparatus 1 according to the first exemplary embodiment of the present invention is installed on a motherboard.

As illustrated in FIG. 1 and FIG. 2, the shape of semiconductor apparatus 1 according to an exemplary embodiment of the present invention is a roughly square plate, and semiconductor apparatus 1 includes semiconductor chip 2 in which a predetermined circuit is formed on main surface 2a. Semiconductor apparatus 1 includes a plurality of electrode pads 3 arranged in line on central line 2d in a main surface 2a side of semiconductor chip 2. Insulating passivation film 4 is formed on main surface 2a of semiconductor chip 2 excluding electrode pad 3, and protects a circuit-formed surface of semiconductor chip 2. In semiconductor chip 2, for example, a logic circuit such as a microprocessor or a storing circuit such as an SRAM (Static Random Access Memory) and a DRAM (Dynamic Random Access Memory) are formed.

Bump electrodes 5 for connecting to the wired board that will be mentioned later are formed on a plurality of electrode pads 3 formed on semiconductor chip 2 respectively. Bump electrode 5 is, for example, formed on electrode pad 3 by ultrasonic thermal compression-bonding a wire, in which a ball is formed at a melted tip, and by breaking the wire.

Wired board 6 configured with a smaller area than that of semiconductor chip 2 is allocated in the main surface 2a side of semiconductor chip 2. Wired board 6 is, for example, a wired board whose shape is a tape, and a plurality of lands 8 for connecting an external terminal that will be mentioned later, and wiring 9 for connecting land 8 and bump electrode 5 formed on electrode pad 3 of semiconductor chip 2 are formed on tape base material 7 made of polyimide resin, and the like. Solder resist 10, which is an insulating protection film, is provided on a surface of tape base material 7 excluding the connection part of land 8, and the like.

Wired board 6 is mounted in a roughly central area of semiconductor chip 2 with being electrically connected to wiring 9 through bump electrode 5 and conductive material 11 such as solder. In the present exemplary embodiment, since bump electrodes 5 are arranged in line on central line $2d$, wired board 6 is formed along a longitudinal direction of semiconductor chip 2 in a rectangle shape. Space areas $2b_1$ and $2c_1$ are formed between edge parts 6b and 6c of wired board 6, and edge parts 2b and 2c of semiconductor chip 2.

The width of space areas $2b_1$ and $2c_1$ is at least 50 μm or more. In the example illustrated in FIG. 2, space area $2b_1$ from edge part 6b of wired board 6 to edge part 2b of semiconductor chip 2 is 50 μm. Meanwhile, an area surrounded by space areas $2b_1$ and $2c_1$ on main surface 2a of semiconductor chip 2 is designated as a central area. As described above, by mounting wired board 6 such that it is separated by 50 μm or more from edge parts 2b and 2c of semiconductor chip 2, the present invention can operate a dicing blade, which rotation-grinds so as to dice a semiconductor wafer, and which prevents wired board 6 from being peeled, and the like. Chamfer parts 12 are formed at four corners of wired board 6, and are configured so that it is difficult to peel wired board 6. Meanwhile, chamfer parts 12 may be shaped in any cut out shape other than an R chamfer as illustrated in the figure, and may be a C chamfer.

Wired board 6 may be allocated in an area other than the central area of semiconductor chip 2. However, even when a warp is induced in semiconductor chip 2 because of a thermal stress, or the like, it is difficult to influence the central area by the warp, and the reliability can be increased, so that it is preferable to mount wired board 6 in the central area of semiconductor chip 2.

Four sides of wired board 6 are allocated within an area of semiconductor chip 2, and wired board 6 is formed so that an area of wired board 6 is smaller than that of semiconductor chip 2, so that the number of wired boards 6 to be produced for each shot can be increased, and the stress that is caused by secondary installation of semiconductor apparatus 1 can be also reduced.

A plurality of external terminals 14 to be installed on motherboard 13, and the like are allocated in a reticular pattern on land 8 provided on wired board 6. External terminal 14 is formed by mounting a ball made of, for example, solder, and the like on land 8 through a flux, and reflowing. The radius side of external terminal 14 is, for example, 0.35 mm, and external terminal 14 is allocated in a 0.5 mm pitch, so that external terminal 14 can be efficiently allocated on wired board 6. External terminals 14 are allocated together on wired board 6 whose area is small, so that wiring 9 on wired board 6 can also be shortened, and electrical characteristics of semiconductor apparatus 1 can be also improved.

Underfill material 15 is provided as insulating sealing material between semiconductor chip 2 and wired board 6. While underfill material 15 may be configured so as to cover at least connection part (connection pad) 16 between bump electrode 5 and wiring 9, in the present exemplary embodiment, since tape-shaped wired board 6 is mounted without bending on semiconductor chip 2, underfill material 15 is provided so as to cover between semiconductor chip 2 and wired board 6.

As described above, in the present invention, semiconductor apparatus 1 is configured with semiconductor chip 2 in which a plurality of electrode pads 3 are provided on main surface 2a, is configured with a plurality of bump electrodes 5 provided on electrode pads 3 of semiconductor chip 2, is configured with wired board 6 is allocated on the main surface 2a side of semiconductor chip 2, and which is positioned in the central area of main surface 2a of semiconductor chip 2 so as to be separated by at least 50 μmm or more from edge parts 2b and 2c of semiconductor chip 2, is configured with a plurality of external terminals 14 are provided on wired board 6, and which are electrically connected to a plurality of bump electrodes 5 through wirings 9 of wired board 6, and is configured with a sealing part is provided between semiconductor chip 2 and wired board 6, and which is made of underfill material 15 covering at least the connection part between bump electrode 5 and wiring 9, thereby, semiconductor apparatus 1 having a real chip size can be realized.

In the present invention, since the area of wired board 6 is smaller than that of semiconductor chip 2, the number of wired boards 6 to be manufactured for each shot can be increased, and the cost of semiconductor apparatus 1 can be reduced. In the present invention, by causing the area of wired board 6 to be smaller than that of semiconductor chip 2, wired boards 6 can be mounted so as to avoid the neighborhood of edge parts 2b and 2c of semiconductor chip 2 to which the stress of the secondary installation of semiconductor apparatus 1 is applied, so that the stress applied to semiconductor apparatus 1 can be reduced. In the present invention, since wired board 6 is smaller than semiconductor chip 2, it also becomes easier to inject underfill material 15 between semiconductor chip 2 and wired boards 6. By causing wired boards 6 to be configured to be smaller than that of semiconductor chip 2, the area of part installed to motherboard 13 can be also reduced. In the present invention, since wiring 9 on wired boards 6 can be configured to be short, the electrical characteristics of semiconductor apparatus 1 can be also improved.

In the present invention, since resin and the like are not provided in the cutting area of semiconductor chip 2, it is possible to improve the cutting capability for dicing, to prevent a dicing blade from being worn down due to a filler included in the resin and the like, and to suppress the dicing blade from being consumed.

In the present invention, as described above, by causing the area of wired board 6 to be smaller than that of semiconductor chip 2, as illustrated in FIG. 3, the area of the part installed on motherboard 13 can be reduced. Thereby, small-size passive parts 17 such as a chip condenser can be mounted in a free area of motherboard 13, so that the present invention can contribute to reducing the size of motherboard 13.

Figure 4:
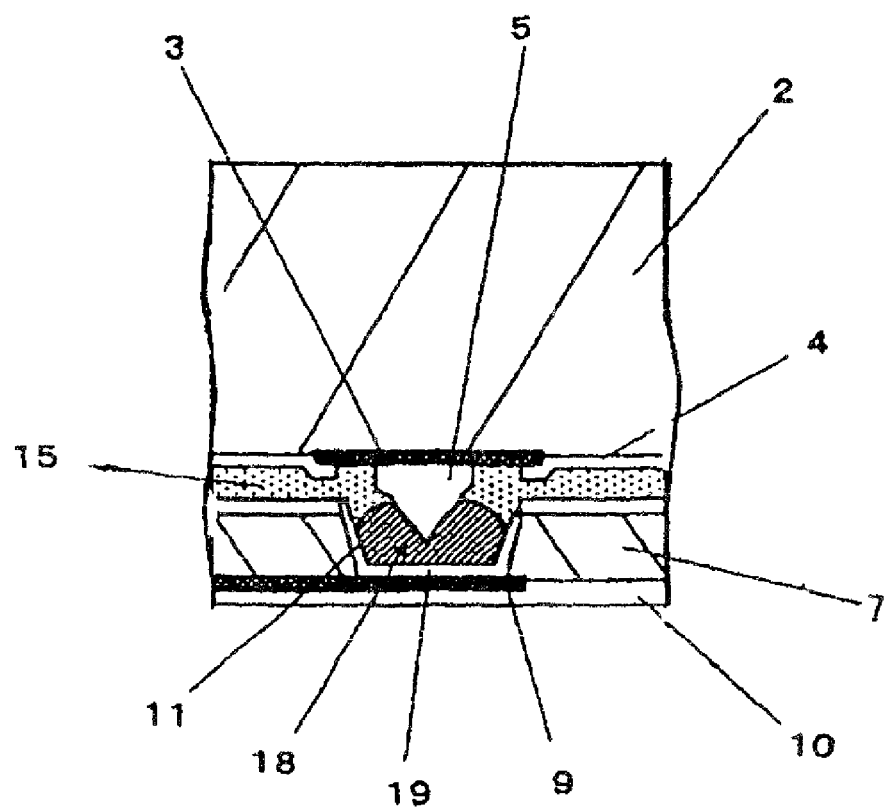
FIG. 4 is a diagram illustrating a modified example of a connection structure between a bump electrode of a semiconductor chip and a wired board.

FIG. 4 is a diagram illustrating a modified example of a connection structure between bump electrode 5 of semiconductor chip 2 and wired board 6, and each of concavity parts 18 is provided at the position of wired board 6 that corresponds to bump electrode 5. Concavity part 18 is sufficient large so as to allow the extent that bump electrode 5 be positioned in Concavity part 18. In concavity part 18, a surface layer wiring of the external terminal side of wired board 6 is configured as being exposed, and bump electrode 5 is connected to the surface layer wiring of the external terminal side of wired board 6 through conductive material 11. Thereby, semiconductor apparatus 1 can be further thinned.

Plating 19 of Cu/Ni/Au is provided on the surface layer wiring in concavity part 18, so that semiconductor chip 2 and wired board 6 can be favorably and electrically connected. Since concavity part 18 is provided in an electrical connection part, the bonding area between semiconductor chip 2 and wired board 6 can be enlarged.

Figure 5:
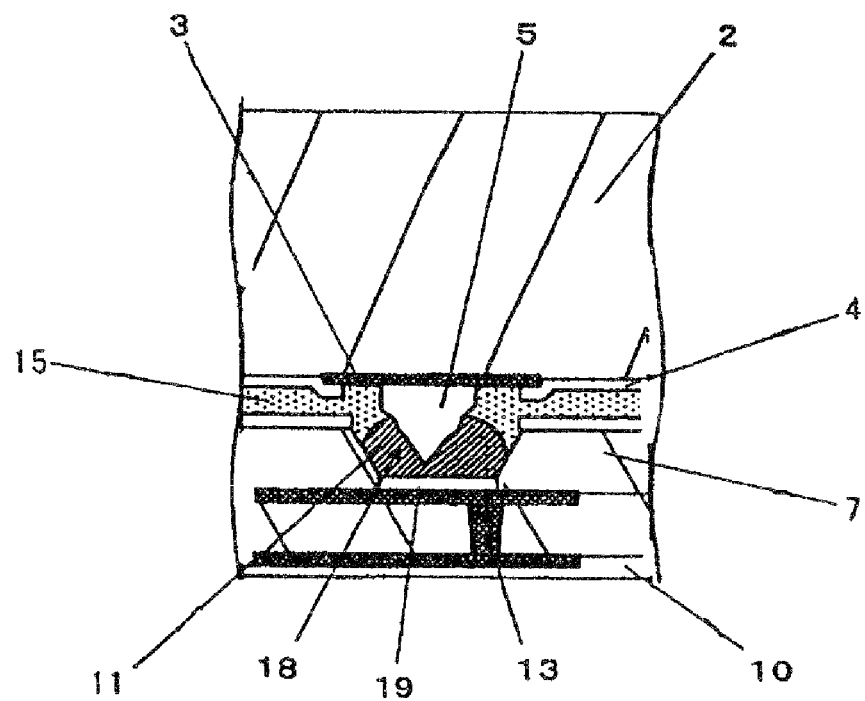
FIG. 5 is a diagram illustrating a modified example of a connection structure when a multilayer wired board is used.

FIG. 5 is a diagram illustrating a modified example of a connection structure when a multilayer wired board is used, As in FIG. 4, concavity part 18 is provided at the part of wired board 6 that corresponds to bump electrode 5, and the multilayer wired board is used so that wiring 9 is exposed in concavity part 18, thereby, the height of semiconductor apparatus 1 is further suppressed, and wiring 9 can be realized in a high density.

Next, a method of manufacturing semiconductor apparatus 1 according to the present exemplary embodiment will be described.

Figure 6:
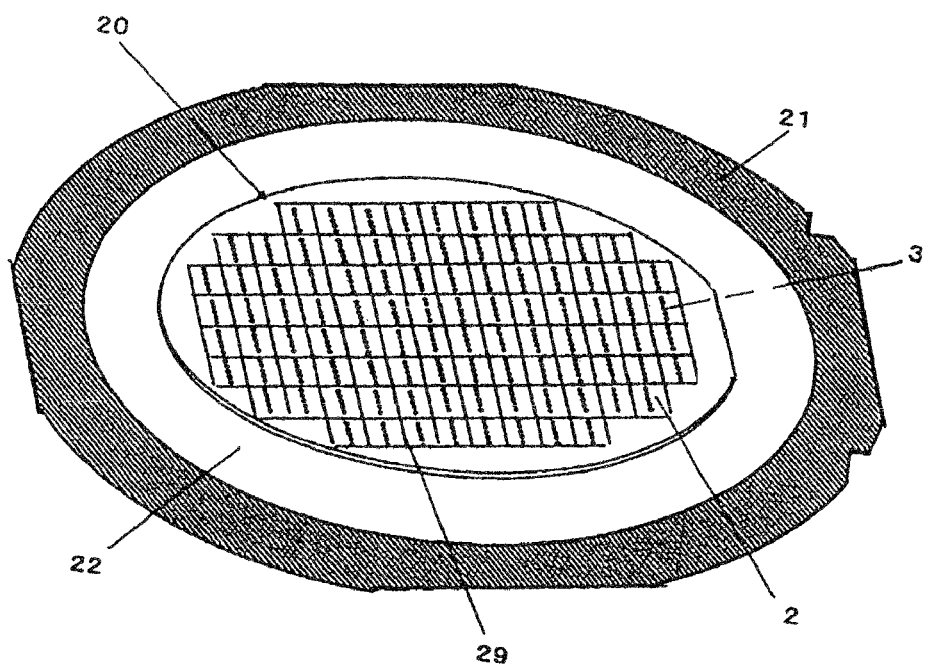
FIG. 6 is a pattern diagram illustrating a semiconductor wafer being held by a jig.
Figure 7A:
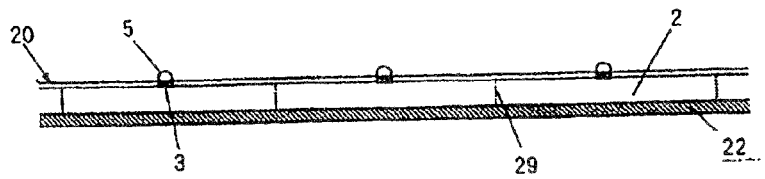
FIG. 7A is a process diagram illustrating a manufacturing process of the semiconductor apparatus according to the first exemplary embodiment of the present invention.
Figure 7B:
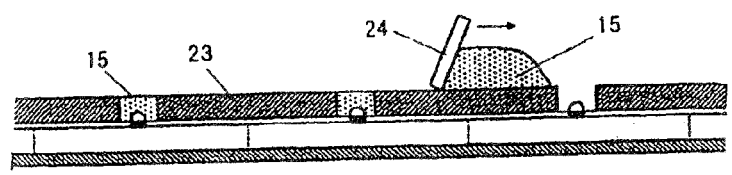
FIG. 7B is a process diagram illustrating a manufacturing process of the semiconductor apparatus according to the first exemplary embodiment of the present invention.
Figure 7C:
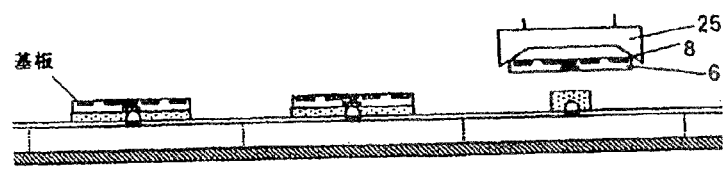
FIG. 7C is a process diagram illustrating a manufacturing process of the semiconductor apparatus according to the first exemplary embodiment of the present invention.
Figure 7D:
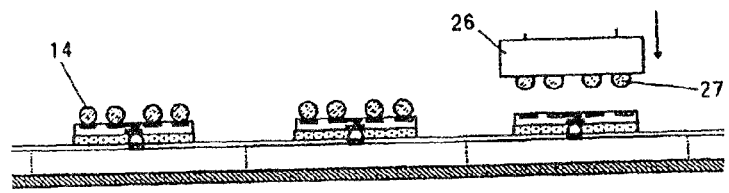
FIG. 7D is a process diagram illustrating a manufacturing process of the semiconductor apparatus according to the first exemplary embodiment of the present invention.
Figure 7E:
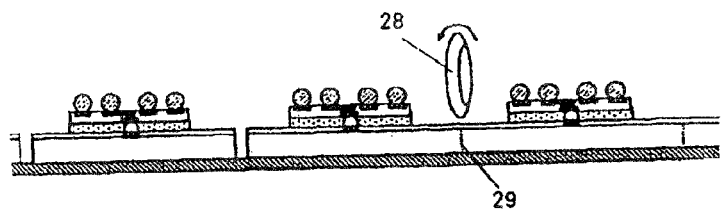
FIG. 7E is a process diagram illustrating a manufacturing process of the semiconductor apparatus according to the first exemplary embodiment of the present invention.
Figure 7F:
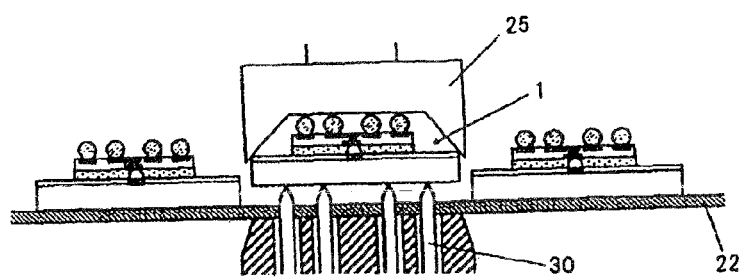
FIG. 7F is a process diagram illustrating a manufacturing process of the semiconductor apparatus according to the first exemplary embodiment of the present invention.
Figure 8:
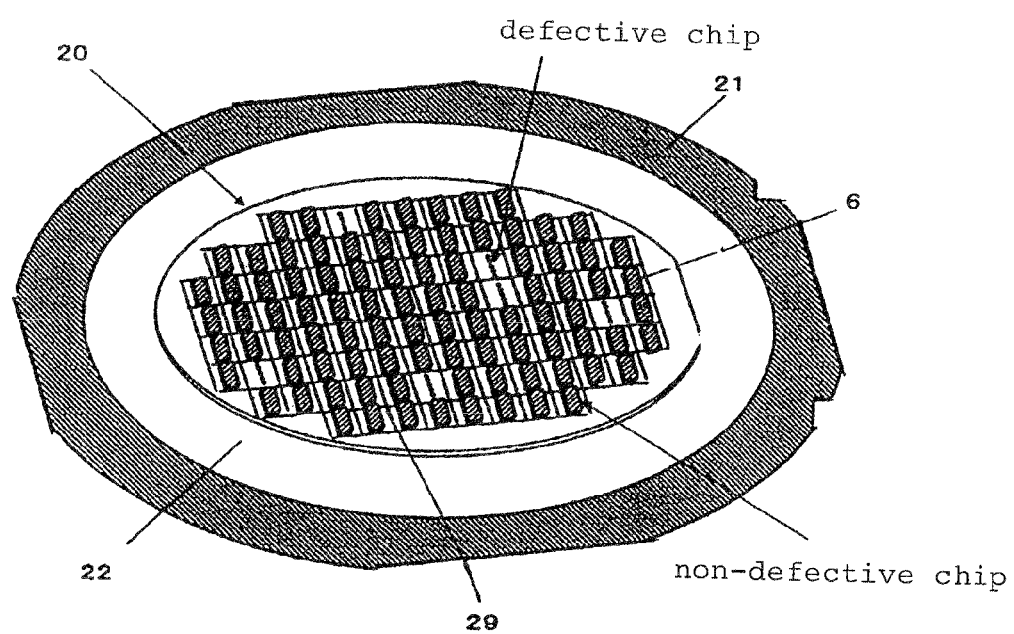
FIG. 8 is a pattern diagram illustrating such a condition in which a wired board is mounted only on the semiconductor chip which is determined as a non-defective product.

FIGS. 6 to 8 are diagrams illustrating the production flow of semiconductor apparatus 1 according to the present exemplary embodiment.

A method of manufacturing semiconductor apparatus 1 according to one exemplary embodiment of the present invention will be described as referring to FIGS. 6 to 8.

First, semiconductor wafer 20 is provided to manufacture semiconductor apparatus 1, which is, for example, obtained by forming desired circuits and electrode pads through a diffusion process, and the like on the main surface of a disk-like substrate obtained by slicing a silicon ingot formed by a single crystal pulling method, or the like.

As illustrated in FIG. 6, adhesive heat-resistant tape 22 is put around frame-like jig 21, and the rear surface of semiconductor wafer 20 is placed and fixed on heat-resistant tape 22. A plurality of electrode pads 3 are formed in each of semiconductor chips 2 provided in semiconductor wafer 20, and as illustrated in FIG. 7A, bump electrode 5 is formed on electrode pad 3. Bump electrode 5 is formed by ultrasonic thermal compression-bonding a wire, in which a ball is formed at a melted tip, on electrode pad 3, and by breaking the wire. Meanwhile, bump electrode 5 may be formed by the plating, or the like.

As illustrated in FIG. 7B, after bump electrode 5 is formed, semiconductor wafer 20 is selectively applied with sealing material, e.g. underfill material 15, so as to cover bump electrode 5 of each semiconductor chip 2. Underfill material 15 can be, for example, selectively formed by mounting mask 23 including an aperture in a bump forming area of semiconductor wafer 20, and pouring underfill material 15 into the aperture with squeegee 24. Meanwhile, underfill material 15 may be configured to be formed on the whole surface by spinner-applying it to semiconductor wafer 20. In the spinner-applying, underfill material 15 that has a uniform thickness can be more efficiently formed on semiconductor wafer 20.

As described above, wired board 6 is previously provided, whose area is smaller than that of semiconductor chip 2, and in which a plurality of lands 8, and desired wiring 9 for connecting land 8 and bump electrode 5 formed on electrode pad 3 of semiconductor chip 2 are formed. Conductive material 11 such as solder is previously provided in the connection part to bump electrode 5 of wired board 6.

As illustrated in FIG. 7C, wired board 6 is mounted on semiconductor chip 2 by aligning electrode pad 3 of semiconductor chip 2 and connection part (connection pad) 16 of wired board 6 while being absorbed by absorbing collet 25, or the like, and electrically connecting connection part (connection pad) 16 of wired board 6 and bump electrode 5 through conductive material 11. As illustrated in FIG. 8, wired board 6 is mounted on only semiconductor chip 2 which is determined as the non-defective product on semiconductor wafer 20 based on a result of a previous burn-in test and the like. As described above, since wired board 6 is not mounted on semiconductor chip 2 which is determined as a defective product, the process efficiency for mounting wired board 6 can be improved. Since wired board 6 can be efficiently utilized, costs can be also reduced.

Wired board 6 may be efficiently mount by providing absorbing collet 25 for mounting wired board 6 with a heating mechanism, and by heating wired board 6 in addition to transferring wired board 6.

By mounting wired board 6 on semiconductor chip 2, underfill material 15 is expanded, which is the sealing material selectively applied so as to cover electrode pad 3, and underfill material 15 covers a space between semiconductor chip 2 and wired board 6. As described above, by covering the connection part between bump electrode 5 and wired board 6, and the space between semiconductor chip 2 and wired board 6 with underfill material 15, it is possible to protect the connection part, and to adhesion-fix wired board 6 without bending. Meanwhile, underfill material 15 may be formed by injecting insulating underfill material 15 from the space between semiconductor chip 2 and wired board 6 after wired board 6 is mounted on semiconductor chip 2.

Semiconductor chip 2 in which wired board 6 is mounted is subjected to a ball mounting process, as illustrated in FIG. 7D, a conductive ball is mounted on land 8 on wired board 6, and a plurality of external terminals 14 are formed. In the ball mounting process, mounting tool 26 in which a plurality of absorbing holes are formed is used by allocating the ball on land 8 on wired board 6. That is, by using mounting tool 26, for example, ball 27 made of solder, or the like is held at the absorbing hole, flux is transcription-formed on held ball 27, and balls 27 are mounted together on land 8 on wired board 6, thereby, a plurality of external terminals 14 are formed. After ball 27 is mounted, ball 27 is fixed by reflowing, and external terminal 14 is formed on land 8.

Next, semiconductor wafer 20 is subjected to a dicing process, and as illustrated in FIG. 7E, semiconductor wafer 20 is cut and separated into each semiconductor chip 2. In the dicing process, semiconductor wafer 20 is, for example, placed on a dicing table, and is cut by rotation-grinding dicing line 29 between semiconductor chips 2 by using high rate-rotating dicing blade 28.

For example, wired board 6 is mounted so that edge parts 6b and 6c thereof are separated from edge parts 2b and 2c of semiconductor chip 2 by 50 μm or more. As described above, by mounting wired board 6 as separated from edge parts 2b and 2c of semiconductor chip 2 by 50 μm or more, it is possible to reduce the peeling of edge parts 6b and 6c of wired board 6 when semiconductor wafer 20 is diced.

Next, as illustrated in FIG. 7F, semiconductor chip 2 is pushed up from the lower side of heat-resistant tape 22 by pushing up means 30 of a picking-up apparatus, and is removed from heat-resistant tape 22, and semiconductor chip 2 on which wired board 6 is mounted is picked up.

Thereby, semiconductor apparatus 1 of a real chip size as illustrated in FIG. 1 can be obtained.

As described above, in the present invention, since semiconductor apparatus 1 is manufactured as a wafer by using wired board 6 whose area is smaller than that of semiconductor chip 2, semiconductor apparatus 1 can be efficiently manufactured. In the present invention, since wired board 6 is used whose area is smaller than that of semiconductor chip 2, the number of wired boards 6 to be manufactured for each shot can be increased, and the cost of semiconductor apparatus 1 can be reduced. In the present invention, since wired board 6 is mounted only on the non-defective chip of semiconductor wafer 20, wired board 6 can be efficiently mounted.

In the present invention, since wired board 6 is mounted so that it is separated from edge parts 2b and 2c of semiconductor chip 2 by 50 μm or more, semiconductor wafer 20 can be favorably cut without coming into contact with dicing blade 28 when being diced. Semiconductor apparatus 1 according to the present exemplary embodiment is structured so that resin and the like are not provided in the cutting area of semiconductor chip 2, so that it is possible to improve the cutting capability for the dicing, to prevent dicing blade 28 from being worn away due to a filler included in the resin, and the like, and to prevent dicing blade 28 from being consumed.

Second Exemplary Embodiment

Figure 9:
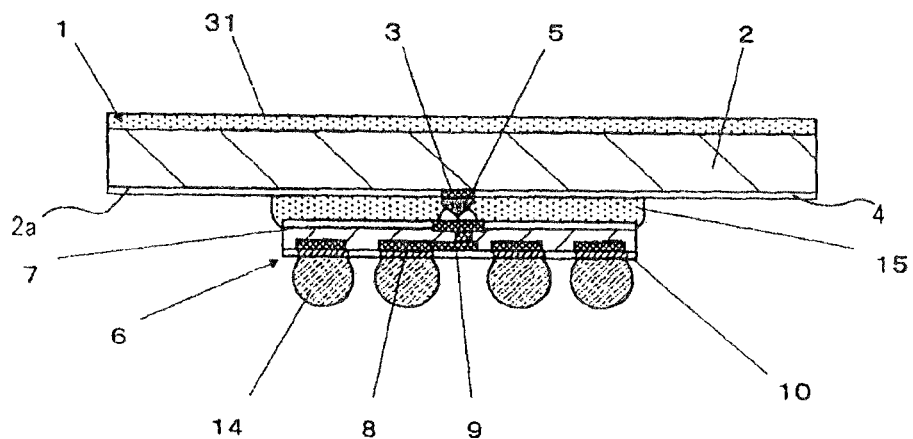
FIG. 9 is a side cross-section diagram of the semiconductor apparatus according to a second exemplary embodiment of the present invention.
Figure 10:
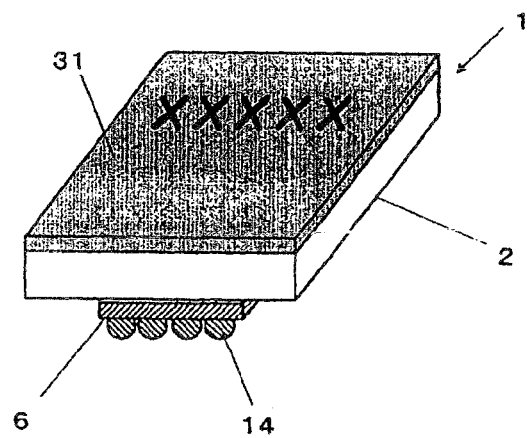
FIG. 10 is a perspective diagram which is obtained by viewing, from a rear surface side, the semiconductor apparatus according to the second exemplary embodiment of the present invention.

FIG. 9 is a side cross-section diagram illustrating the package structure of semiconductor apparatus 1 according to the present exemplary embodiment. FIG. 10 is a perspective diagram which is obtained by viewing, from a rear surface side, semiconductor apparatus 1 according to the present exemplary embodiment.

The shape of semiconductor apparatus 1 according to the present exemplary embodiment is a roughly square plate as in the first exemplary embodiment, and semiconductor apparatus 1 includes semiconductor chip 2 in which a predetermined circuit is formed on main surface 2a. Semiconductor apparatus 1 includes a plurality of electrode pads 3 arranged in line on a roughly central area, for example, a central area of main surface 2a side of semiconductor chip 2. Insulating passivation film 4 is formed on main surface 2a of semiconductor chip 2 excluding electrode pads 3, and protects a circuit-formed surface of semiconductor chip 2.

As in the first exemplary embodiment, bump electrodes 5 for connecting to wired board 6 are formed on a plurality of electrode pads 3 formed on semiconductor chip 2 respectively. Wired board 6 whose area is smaller than that of semiconductor chip 2 is allocated in an upper side of main surface 2a of semiconductor chip 2. Wired board 6 is a wired board whose shape is, for example, a tape, and a plurality of lands 8 for connecting an external terminal that will be mentioned later, and wirings 9 for connecting land 8 and bump electrode 5 formed on electrode pad 3 of semiconductor chip 2 are formed on tape base material 7 made of polyimide resin, and the like. An insulating protection film, e.g. solder resist 10, is provided on a surface of tape base material 7 excluding a connection part such as land 8.

Wired board 6 is electrically connected to wiring 9 through conductive material 11 to be mounted in the roughly central area of semiconductor chip 2. In the present exemplary embodiment, since bump electrodes 5 are provided in line on the central area, wired board 6 is formed along a longitudinal direction of semiconductor chip 2 in a rectangle shape. Chamfer parts 12 are formed at four corners of wired board 6, and are configured so that it is difficult to peel wired board 6.

The feature of the present exemplary embodiment is, in addition to the features of the first exemplary embodiment, that insulating protection material (first protection material) 31 is provided on the whole surface of an opposite side surface (the other surface) of main surface 2a of semiconductor chip 2. Epoxy resin, or the like is, for example, used for protection material 31. After semiconductor wafer 20 is back-grinded, protection material 31 is formed on the whole back surface of semiconductor wafer 20 in a uniform thickness by spinner-applying liquid resin.

As illustrated in FIG. 9, since first protection material 31 made of insulating resin is provided on the other surface side of semiconductor chip 2, the occurrence of cracks and a chipping in semiconductor chip 2 can be reduced. If first protection material 31 is configured with colored material, as illustrated in FIG. 10, it becomes possible to clearly display a mark formed in the other surface side of semiconductor chip 2.

As described above, in the present invention, semiconductor apparatus 1 is configured with semiconductor chip 2 in which a plurality of electrode pads 3 are provided on main surface 2a, is configured with a plurality of bump electrodes 5 provided on electrode pads 3 of semiconductor chip 2, is configured with wired board 6 which is allocated on the main surface 2a side of semiconductor chip 2, and whose area is smaller than that of semiconductor chip 2, is configured with a plurality of external terminals 14 which are provided on wired board 6, and which are electrically connected to a plurality of bump electrodes 5 through wirings 9 of wired board 6, is configured with sealing material which is provided between semiconductor chip 2 and wired board 6, and which is made of underfill material 15 covering at least the connection part between bump electrodes 5 and wiring 9, is configured with first protection material 31 which is provided so as to cover a rear surface of semiconductor chip 2 in a surface side facing main surface 2a of semiconductor chip 2, thereby, semiconductor apparatus 1 having a real chip size can be realized, and a chip rear surface can be protected. Since colored protection material is formed on the whole rear surface of semiconductor chip 2, the mark formed on the rear surface of semiconductor chip 2 can be clearly displayed.

In the present invention, since wired board 6 becomes smaller, and the number of wired boards 6 to be manufactured for each shot can be increased, the cost of semiconductor apparatus 1 can be reduced. In the present invention, by causing an area of wired board 6 to be smaller than that of semiconductor chip 2, the stress applied to semiconductor chip 2 can be reduced. In the present invention, since wired board 6 is small, it also becomes easy to pour underfill material 15 between semiconductor chip 2 and wired boards 6. In the present invention, since wired board 6 is caused to be small, the area of an installation part to motherboard 13 can be also decreased. In the present invention, since wiring 9 on wired board 6 can be configured to be short, the electrical characteristics of semiconductor apparatus 1 can be also improved.

In the present invention, since resin and the like are not provided in the cutting area of semiconductor chip 2, it is possible to improve the cutting capability for dicing, to prevent dicing blade 28 from being worn away due to a filler included in the resin, and the like, and to prevent dicing blade 28 from being consumed.

Next, a method of manufacturing semiconductor apparatus 1 according to the present exemplary embodiment will be described as referring to FIG. 11A to FIG. 11D.

First, as in the first exemplary embodiment, semiconductor wafer 20 is provided, in which a desired circuit and electrode pad 3 are formed.

Figure 11A:
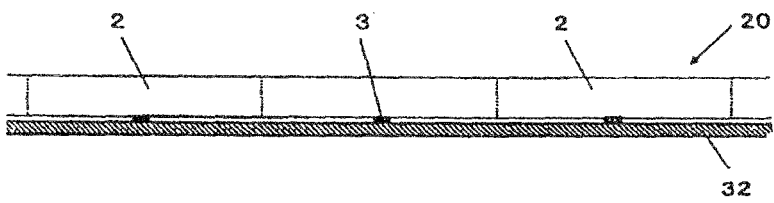
FIG. 11A is a process diagram illustrating a manufacturing process of the semiconductor apparatus according to the second exemplary embodiment of the present invention.
Figure 11B:
FIG. 11B is a process diagram illustrating a manufacturing process of the semiconductor apparatus according to the second exemplary embodiment of the present invention.

As illustrated in FIG. 11A, a main surface, i.e. a circuit-formed surface of semiconductor wafer 20 is adhesion-fixed to BG tape 32. Next, the other surface side of semiconductor wafer 20 is grinded according to a back-grinding process, and as illustrated in FIG. 11B, semiconductor wafer 20 is thinned to a thickness around 750 μm.

Figure 11C:
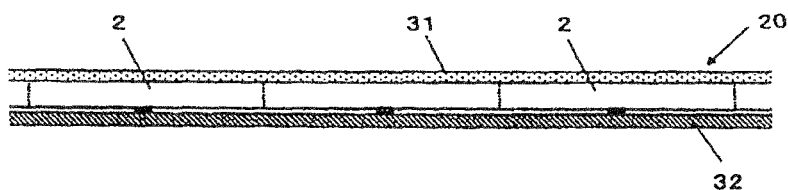
FIG. 11C is a process diagram illustrating a manufacturing process of the semiconductor apparatus according to the second exemplary embodiment of the present invention.
Figure 11D:
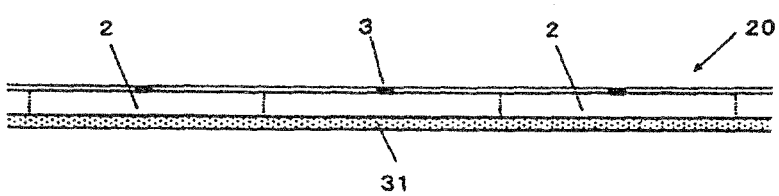
FIG. 11D is a process diagram illustrating a manufacturing process of the semiconductor apparatus according to the second exemplary embodiment of the present invention.

After the back-grinding, as illustrated in FIG. 11C, while being adhesion-fixed to BG tape 32, first protection material 31 is formed on the entire other surface of semiconductor wafer 20. First protection material 31 is, for example, formed on a whole surface by spinner-applying insulating resin for the potting. First protection material 31 can be formed in a uniform thickness by forming with the spinner-applying. As illustrated in FIG. 11D, since first protection material 31 is formed on a rear surface of semiconductor wafer 20, it becomes easy to handle and transfer semiconductor wafer 20 which is thinned in the back-grinding process.

Next, as in the first exemplary embodiment, in semiconductor wafer 20 in which first protection material 31 is formed on the rear surface, bump electrode 5 is formed in electrode pad 3 of semiconductor chip 2, and the sealing material, e.g. underfill material 15 is selectively applied so as to cover bump electrode 5 of semiconductor chip 2.

As described above, wired board 6 is previously provided, whose area is smaller than that of semiconductor chip 2, and in which a plurality of lands 8, and desired wiring 9 for connecting land 8 and bump electrode 5 formed on electrode pad 3 of semiconductor chip 2 are formed. As in the first exemplary embodiment, wired board 6 is mounted on semiconductor chip 2. By mounting wired board 6 on semiconductor chip 2, the sealing material is expanded, which is selectively applied so as to cover electrode pad 3, and which covers a space between semiconductor chip 2 and wired board 6. In semiconductor chip 2 in which wired board 6 is mounted, the conductive ball is mounted on land 8 on wired board 6, and a plurality of external terminals 14 are formed.

Next, semiconductor wafer 20 is subjected to the dicing process, and semiconductor wafer 20 is cut and separated into each semiconductor chip 2. Here, in addition to semiconductor wafer 20 which is cut and separated, first protection material 31, which is formed on the rear surface of semiconductor wafer 20, is also cut and separated.

After semiconductor wafer 20 is cut and separated into each semiconductor chip 2, the adhesive force is reduced by UV-radiating BG tape 32. The rear surface of semiconductor chip 2 is pushed up from a lower side of BG tape 32, whose adhesive force is reduced, by pushing up means 30 of a picking-up apparatus, and is removed from BG tape 32, and semiconductor chip 2 on which wired board 6 is mounted is picked up. Here, in the present exemplary embodiment, first protection material 31 is provided on the rear surface of semiconductor chip 2. Thus, since the rear surface of semiconductor chip 2 is not directly pushed up when semiconductor chip 2 is picked up, the occurrence of cracks and a chipping in semiconductor chip 2 can be reduced.

Since semiconductor apparatus 1 is manufactured as a wafer by using wired board 6 whose area is smaller than that of semiconductor chip 2, semiconductor apparatus 1 can be efficiently manufactured. Since wired board 6, whose area is smaller than that of semiconductor chip 2, is used, the number of wired boards 6 to be manufactured for each shot can be increased, and the cost of semiconductor apparatus 1 can be reduced.

Semiconductor apparatus 1 according to the present exemplary embodiment is structured so as not to include resin and the like in a cutting area of semiconductor chip 2, so that it is possible to improve the cutting capability for dicing, to prevent dicing blade 28 from being worn away due to a filler included in the resin, and the like, and to prevent dicing blade 28 from being consumed.

Third Exemplary Embodiment

Figure 12:
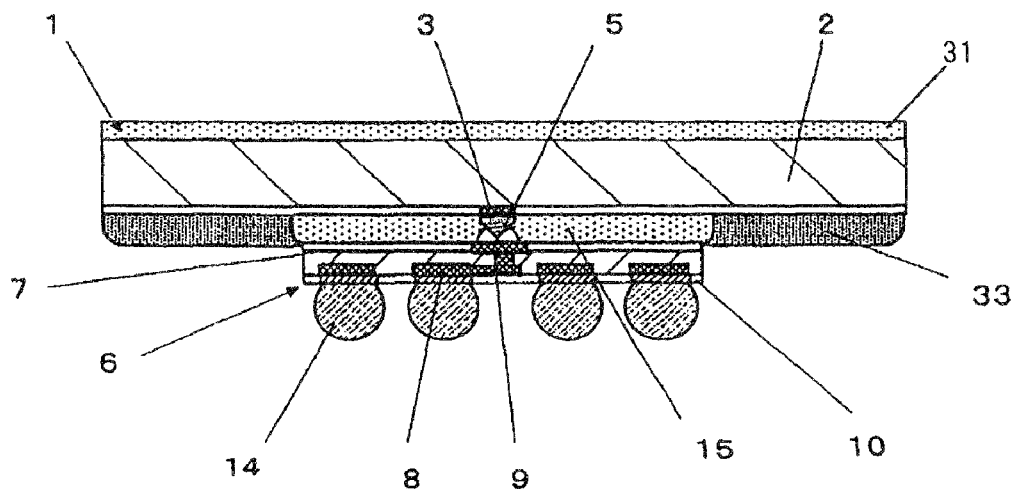
FIG. 12 is a side cross-section diagram of the semiconductor apparatus according to a third exemplary embodiment of the present invention.

FIG. 12 is a cross-section diagram illustrating a package structure of semiconductor apparatus 1 according to the present exemplary embodiment.

In addition to the configuration of semiconductor apparatus 1 according to the first or second exemplary embodiment, semiconductor apparatus 1 according to the present exemplary embodiment includes second insulating protection material 33 in an area excluding an area in which wired board 6 is mounted on main surface 2a of semiconductor chip 2. In other words, since second protection material 33 is formed as surrounding an area in which wired board 6 is mounted, the circuit surface of semiconductor apparatus 1 can be protected. Thereby, the occurrence of cracks and a chipping in semiconductor chip 2 can be prevented.

Figure 13:
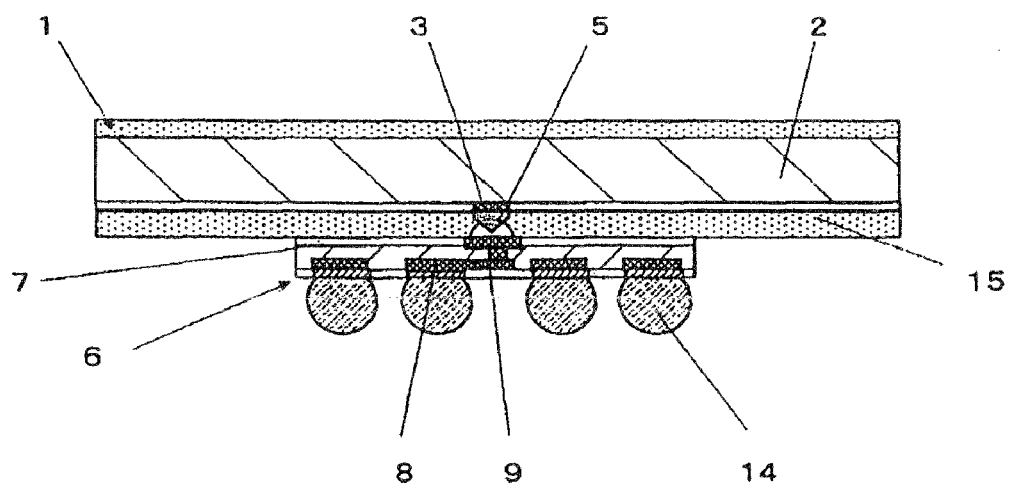
FIG. 13 is a side cross-section diagram illustrating such an example in which sealing material and second protection material are formed together by spinner-applying the same material.
Figure 14A:
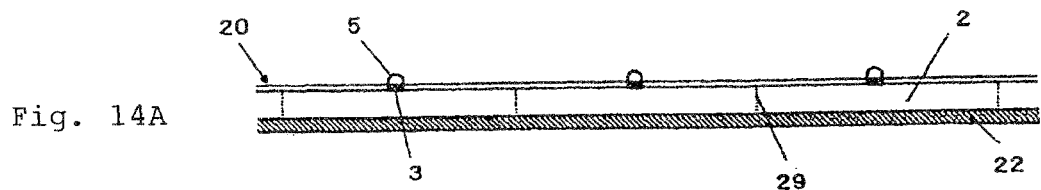
FIG. 14A is a process diagram illustrating a manufacturing process of the semiconductor apparatus illustrated in FIG. 13.
Figure 14B:
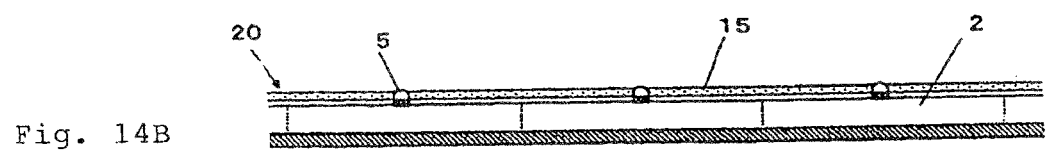
FIG. 14B is a process diagram illustrating a manufacturing process of the semiconductor apparatus illustrated in FIG. 13.
Figure 14C:
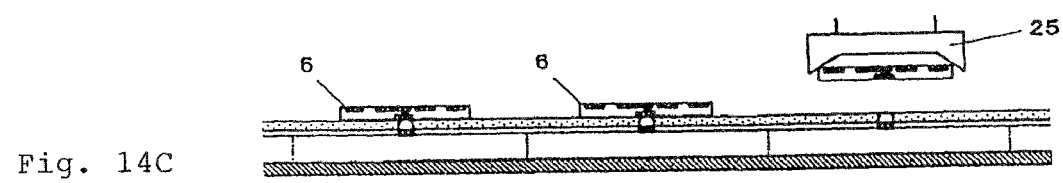
FIG. 14C is a process diagram illustrating a manufacturing process of the semiconductor apparatus illustrated in FIG. 13.
Figure 14D:
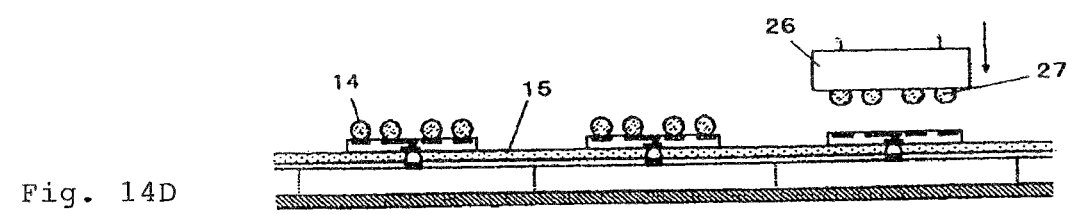
FIG. 14D is a process diagram illustrating a manufacturing process of the semiconductor apparatus illustrated in FIG. 13.
Figure 14E:
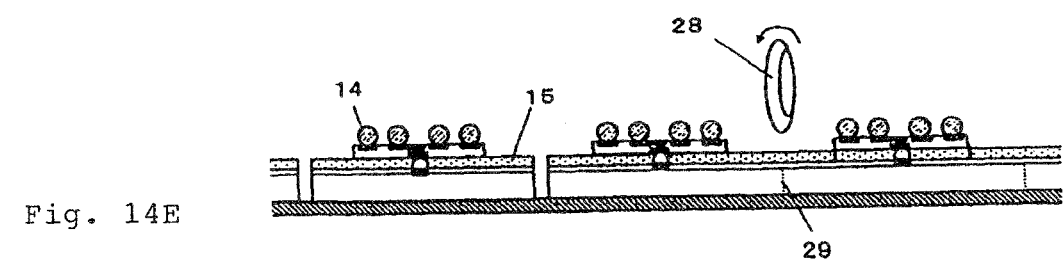
FIG. 14E is a process diagram illustrating a manufacturing process of the semiconductor apparatus illustrated in FIG. 13.
Figure 14F:
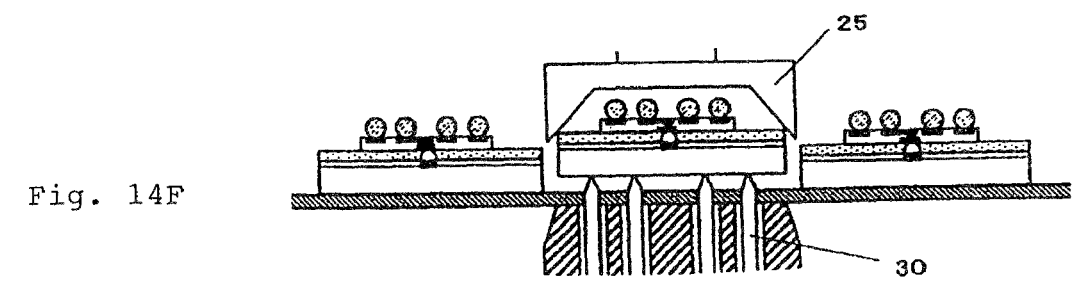
FIG. 14F is a process diagram illustrating a manufacturing process of the semiconductor apparatus illustrated in FIG. 13.

FIG. 13 is a cross-section diagram illustrating a modified example of semiconductor apparatus 1 according to the present exemplary embodiment.

In the present exemplary embodiment, the above sealing material and second protection material 33 are configured to be formed together by spinner-applying the same material. As illustrated in FIG. 14A to FIG. 14F, after bump electrode 5 is formed on semiconductor wafer 20, underfill material 15 is formed on main surface 2a of semiconductor wafer 20 by spinner-applying, and wired board 6 is mounted, thereby, it is possible to efficiently form the sealing part and also second protection material 33.

Figure 15:
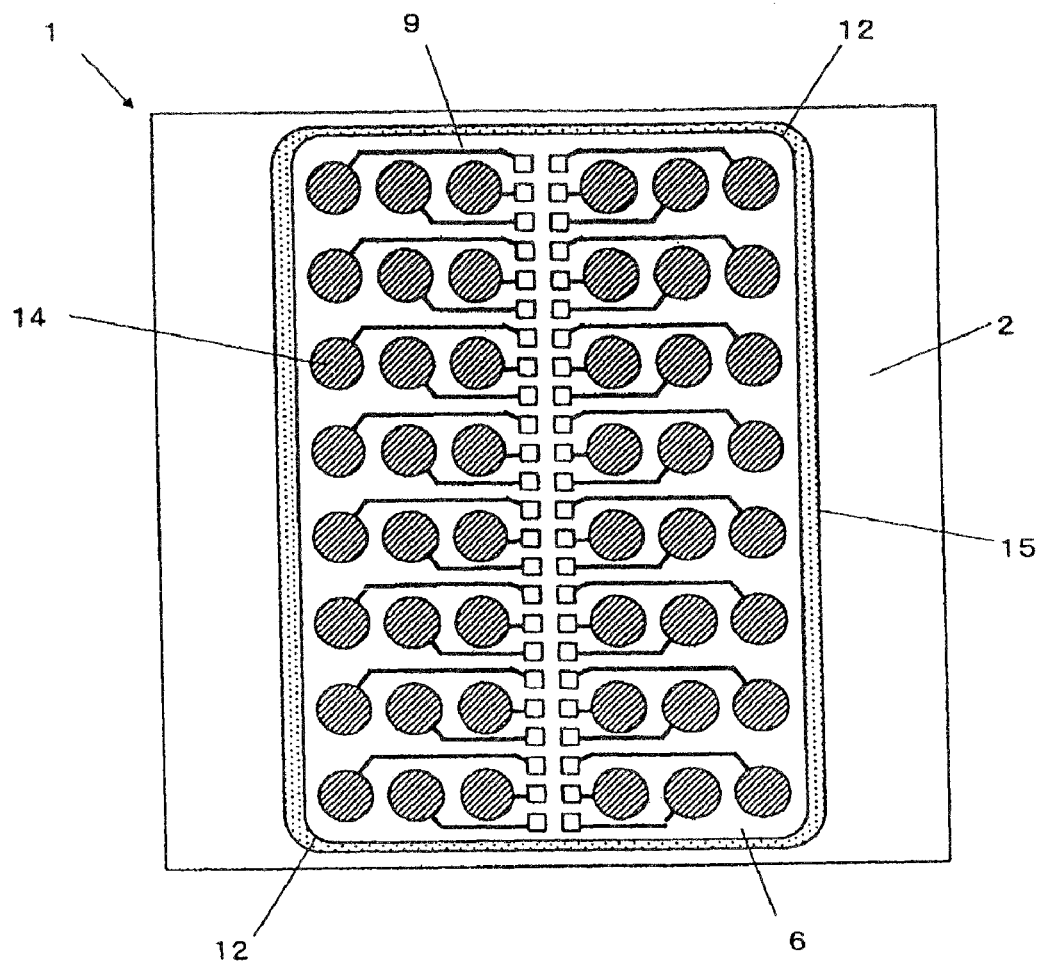
FIG. 15 is a plane diagram of the semiconductor apparatus of the present invention, in which the semiconductor chip is mounted in which two lines of the electrode pads are arranged in a central area.
Figure 16:
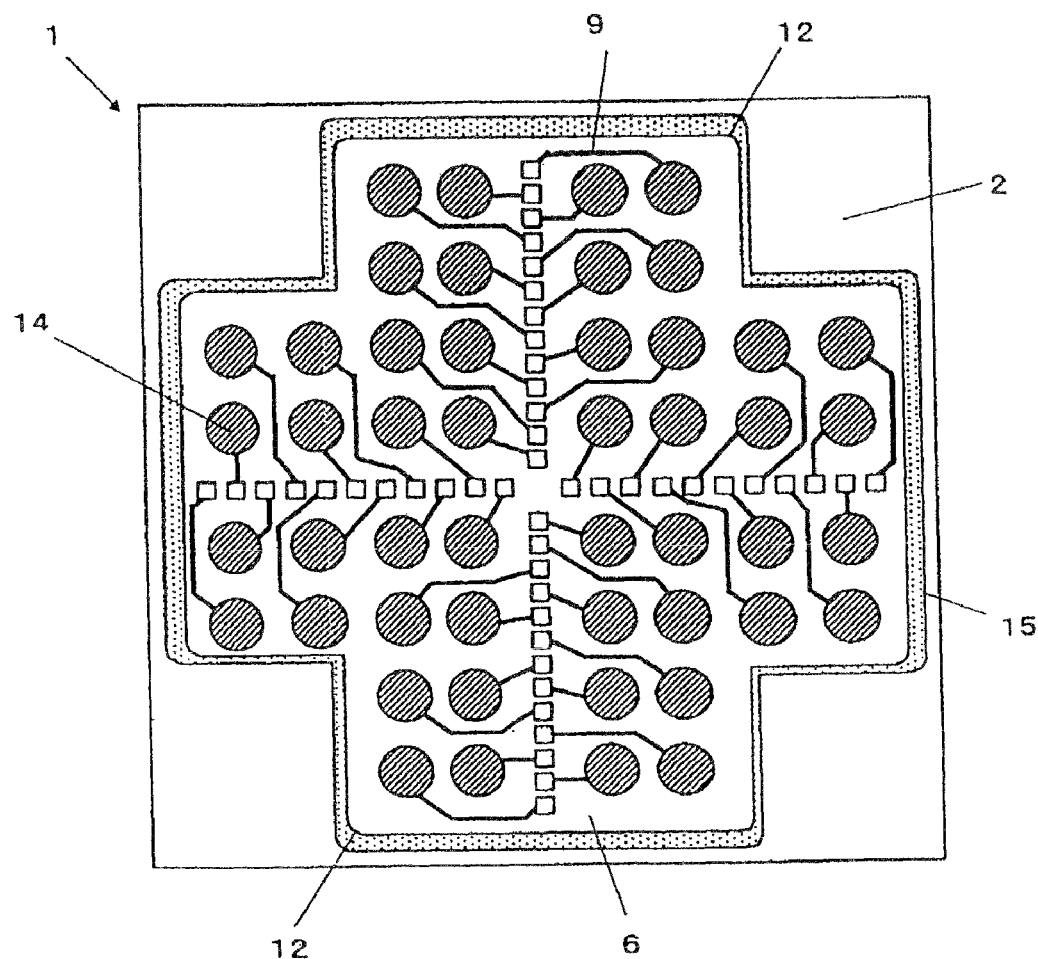
FIG. 16 is a plane diagram of the semiconductor apparatus of the present invention, in which the semiconductor chip is mounted in which the electrode pads are arranged in a cross-shape in the central area.

As described above, the invention made by the present inventor has been described based on the exemplary embodiments, the present invention is not limited to the above exemplary embodiments, and a variety of changes and modifications can be applied without departing from the concept of the present invention. For example, in the present exemplary embodiments, such a case has been described that the present invention is applied to a semiconductor chip in which a line of electrode pads are arranged in a central area, however, the present invention can be also applied to the semiconductor chip, as illustrated in FIG. 15, in which two lines of electrode pads are arranged in the central area, and can also be applied to the semiconductor chip, as illustrated in FIG. 16, in which the electrode pads are arranged in a cross-shape in the central area.

Figure 17:
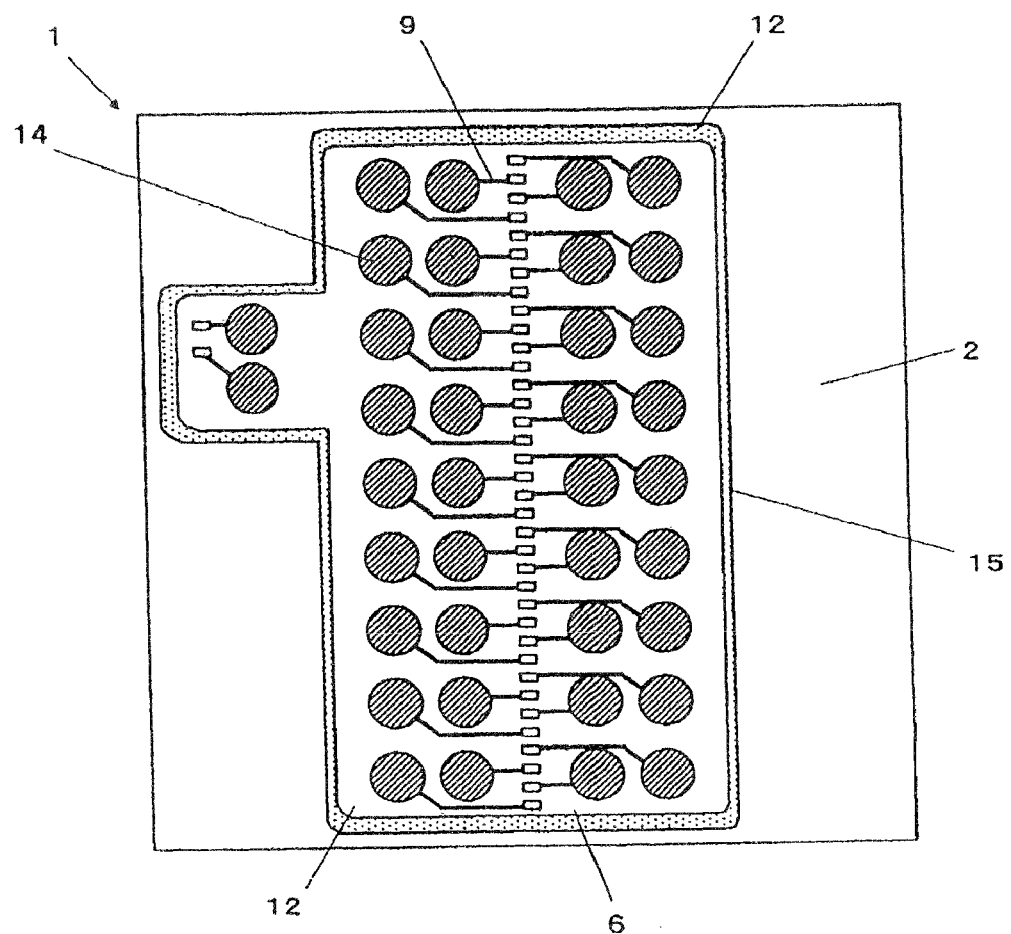
FIG. 17 is a plane diagram of the semiconductor apparatus of the present invention, in which the semiconductor chip is mounted in which the electrode pads are arranged in a cross-shape in the central area.

The present invention can also be applied to semiconductor apparatus 1, as illustrated in FIG. 17, in which the electrode pads are arranged in a peripheral part of the central area.

Figure 18:
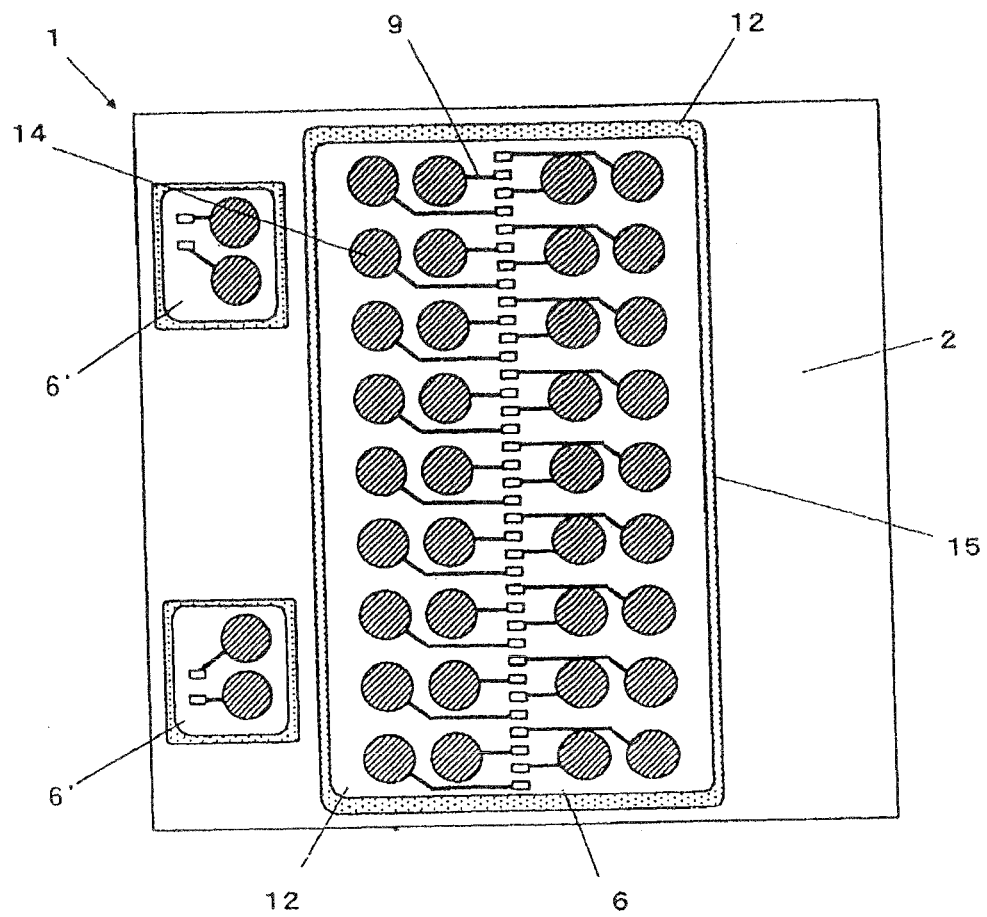
FIG. 18 is a plane diagram of the semiconductor apparatus in which the wired board and the small wired board are mounted in the central area of the semiconductor chip.

In addition, as illustrated in FIG. 18, the present invention can also be applied to semiconductor apparatus 1 in which wired board 6 and small wired board 6' whose area is smaller than that of wired board 6 are mounted in the central area. Meanwhile, the present invention can be also obviously applied to semiconductor apparatus 1 in which a plurality of small wired boards 6' are mounted.

Figure 19:
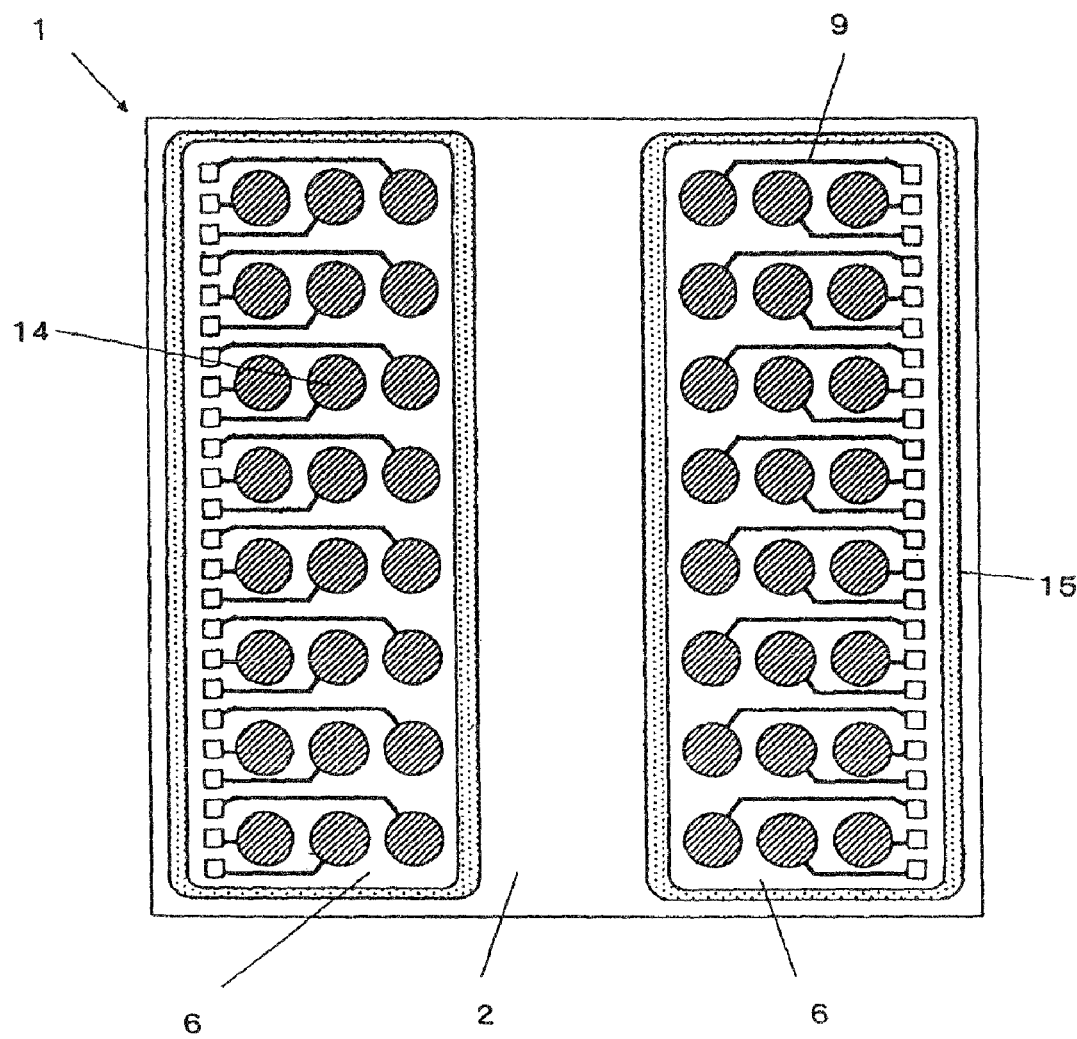
FIG. 19 is a plane diagram of the semiconductor apparatus in which a plurality of the wired boards are mounted in the central area of the semiconductor chip.

As illustrated in FIG. 19, the present invention can also be applied to semiconductor apparatus 1 in which a plurality of wired boards 6 are mounted in the central area.

In the present exemplary embodiments, such a case has been described in which a tape-shaped wired board is used, however, a rigid board such as a glass epoxy board may be used.

In the present exemplary embodiments, such a case has been described in which the present invention is applied to the BGA-type semiconductor apparatus, however, the present invention can be applied to the semiconductor apparatus in which a wired board such as CSP (Chip Size Package), MCP (Multi Chip Package), and SiP (System in Package) is used.

While preferred embodiments of the present invention have been described using specific terms, such description is for illustrative purposes only, and it is to be understood that changes and variations may be made without departing from the spirit or scope of the following claims.

What is claimed is:

1. A semiconductor apparatus manufacturing method, comprising:

providing a semiconductor wafer in which a semiconductor chip is formed, the semiconductor chip being provided with a predetermined circuit and a plurality of electrode pads on a main surface;

forming bump electrodes on the plurality of electrode pads;

providing a wired board whose area is smaller than that of the semiconductor chip, and which includes land parts corresponding to the plurality of electrode pads formed on the semiconductor chip respectively, and a wiring for electrically connecting the electrode pads and the land parts;

mounting the wired board on the semiconductor chip which is determined as a non-defective product of the semiconductor chips formed on the semiconductor wafer by electrically connecting the electrode pads of the semiconductor chip and the wiring electrically connected to the land parts; and cutting and separating the semiconductor wafer on which the wired board is mounted onto each of the semiconductor chips, and picking up the separated semiconductor chip.

2. The semiconductor apparatus manufacturing method according to claim 1, further comprising:
applying sealing material to the plurality of electrode pads of the semiconductor wafer before mounting the wired board; and
forming insulating protection material in a connection part between the semiconductor chip and the wired board when mounting the wired board.

3. The semiconductor apparatus manufacturing method according to claim 2, further comprising:
when applying the sealing material, mounting a mask on the semiconductor wafer; and selectively forming the protection material on the electrode pad.

4. The semiconductor apparatus manufacturing method according to claim 2, further comprising:
when applying the sealing material, forming the protection material on the semiconductor wafer by spinner-applying.

5. The semiconductor apparatus manufacturing method according to claim 1, further comprising:
forming external terminals by mounting conductive balls on a plurality of the land parts of the wired board.

6. The semiconductor apparatus manufacturing method according to claim 1,
wherein the wired board is mounted in an area of the main surface of the semiconductor chip so as to be separated from an edge part of the semiconductor chip by at least 50 μm or more.

7. The semiconductor apparatus manufacturing method according to claim 1, further comprising:
when picking up the semiconductor chip, picking up only the semiconductor chip in which the wired board is mounted.

8. The semiconductor apparatus manufacturing method according to claim 1, further comprising:
before forming the bump electrode, forming first protection material on a surface in an opposite side of the main surface of the semiconductor chip.

9. A method of manufacturing a semiconductor device, comprising:
providing a semiconductor wafer including a plurality of semiconductor chips therein, the semiconductor chips being defined by scribe lines and joined with one another, each of the semiconductor chips including a plurality of electrode pads on a side of a first main surface of the semiconductor wafer;
providing a plurality of wired boards separately from one another, each of the wired boards being smaller in size than each of the semiconductor chips and including a plurality of terminals;
mounting each of the wired boards on an associated one of the semiconductor chips in the semiconductor wafer to electrically connect the terminals of each of the wired boards to the electrode pads of the associated one of the semiconductor chips; and
dicing the semiconductor wafer along the scribe lines thereof to separate the semiconductor chips each accompanying an associated one of the wired board from one another.

10. The method of manufacturing a semiconductor device according to claim 9, further comprising:
forming bump electrodes on the electrode pads of the semiconductor chips so that the terminals of each of the wired boards are connected through the bump electrodes to the electrode pads of the associated one of the semiconductor chips.

11. The method of manufacturing a semiconductor device according to claim 9, wherein the wired boards are mounted on the associated one of the semiconductor chips so as to be separated from an edge part of the semiconductor chip by at least 50 μm.

12. The method of manufacturing a semiconductor device according to claim 10, wherein the semiconductor wafer includes a second main surface opposite to the first main surface and the method further comprises:
forming a protective layer on the second main surface of the semiconductor wafer before forming the bump electrodes on the electrode pads of the semiconductor chips.

13. The method of the manufacturing a semiconductor device according to claim 12, wherein the forming the protective layer is carried out by spinner-applying insulating resin potting.

14. The method of manufacturing a semiconductor device according to claim 10, further comprising:
applying sealing material to the plurality of electrode pads of the semiconductor chips in the semiconductor wafer before mounting each of the wired boards on the associated one of the semiconductor chips; and
forming the sealing member in a connection part between the semiconductor chip and wired board when mounting each of the wired boards on the associated one of the semiconductor chips.

15. The method of manufacturing a semiconductor device according to claim 9, wherein the wired boards are mounted within a central area of the associated one of the semiconductor chips.

16. The method of manufacturing a semiconductor device according to claim 9, further comprising:
forming an external terminal by mounting conductive balls on the plurality of terminals of the wired board.

17. The method of manufacturing a semiconductor device according to claim 9, further comprising forming a protective layer on a second main surface of the semiconductor wafer that is a surface of the semiconductor wafer opposite the first main surface.

18. A method of manufacturing a semiconductor device, comprising:
providing a semiconductor chip which comprises a first surface, a second surface opposite to the first surface, and a plurality of electrode pads arranged in line in a central area of the first surface;
providing a wired board that is smaller in size than the semiconductor chip, the wired board comprising a third surface, a fourth surface opposite to the third surface, a plurality of connection pads arranged in line in a central area of the third surface, and a plurality of land terminals formed on the fourth surface and electrically connected to the connection pads; and
mounting the wired board on the semiconductor chip such that an edge of the wired board is distant from an edge of the semiconductor chip toward an inside of the semiconductor chip by at least 50 μm, the connection pads of the wired board being electrically connected to an associated one of the electrode pads of the semiconductor chip.

19. The method of manufacturing a semiconductor device according to claim 18, further comprising:
forming bump electrodes on the electrode pads of the semiconductor chip so that the land terminals of the wired board are connected through the bump electrodes to the electrode pads of the semiconductor chip.

20. The method of manufacturing a semiconductor device according to claim 18, further comprising:

applying sealing material to the plurality of electrode pads of semiconductor chip before mounting the wired board on the semiconductor chip; and forming the sealing member between the electrode pads of the semiconductor chip and the connection pads of the wired board.

21. A method of manufacturing a semiconductor device, comprising:

providing a semiconductor wafer including a plurality of semiconductor chips therein, the semiconductor chips being defined by scribe lines and joined with one another, each of the semiconductor chips including a plurality of electrodes on side of a first main surface of the semiconductor wafer;

forming a protective layer on a second main surface of the semiconductor wafer that is a surface of the semiconductor wafer opposite to the first main surface;

providing a plurality of wired boards separately from one another, each of the wired boards being smaller in size than each of the semiconductor chips and including a plurality of terminals;

mounting each of the wired boards on an associated one of the semiconductor chips in the semiconductor wafer to electrically connect the terminals of each of the wired boards to the electrodes of the associated one of the semiconductor chips; and dicing the semiconductor wafer along the scribe lines thereof to separate the semiconductor chips each accompanying an associated one of the wired boards from one another.

* * * * *